(12) United States Patent
Hsieh et al.

(10) Patent No.: US 12,431,989 B2
(45) Date of Patent: Sep. 30, 2025

(54) METHOD AND SYSTEM FOR EVALUATING RADIO PERFORMANCE

(71) Applicant: MEDIATEK Inc., Hsin-Chu (TW)

(72) Inventors: Shih-Wei Hsieh, Hsinchu (TW);
Che-Chuan Hu, Hsinchu (TW);
Chih-Wei Lee, Hsinchu (TW);
Ting-Wei Kang, Hsinchu (TW);
Shyh-Tirng Fang, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 544 days.

(21) Appl. No.: 17/818,458

(22) Filed: Aug. 9, 2022

(65) Prior Publication Data
US 2024/0056201 A1 Feb. 15, 2024

(51) Int. Cl.
*H04B 17/29* (2015.01)
*G01R 29/08* (2006.01)
*G01R 29/10* (2006.01)
*H04B 17/10* (2015.01)

(52) U.S. Cl.
CPC ....... *H04B 17/104* (2015.01); *G01R 29/0871* (2013.01); *G01R 29/105* (2013.01)

(58) Field of Classification Search
CPC .. H01Q 3/08; H01Q 1/36; H01Q 3/30; H01Q 3/10; H01Q 15/00; H04B 17/318; H04B 17/00; H04B 17/29; H04B 17/15; G02B 1/10; G06F 15/16; G06F 30/27; G06F 9/50; G01R 31/28; G01R 29/08; G01R 29/10
See application file for complete search history.

(56) References Cited

U.S. PATENT DOCUMENTS

2022/0038197 A1\* 2/2022 Endo .................. H04B 17/0085

\* cited by examiner

*Primary Examiner* — Tu X Nguyen
(74) *Attorney, Agent, or Firm* — McClure, Qualey & Rodack, LLP

(57) ABSTRACT

A method for evaluating radio performance of a device under test (DUT) comprises the following steps. A first set of points, a second set of points and a third set of points are defined to locate on a sphere surrounding the DUT. A signal power of the DUT is evaluated at the first set of points to identify a first region related to the first set of points. Candidates of the second set of points are selected based on the first region. The signal power of the DUT is evaluated at the candidates of the second set of points to identify a second region related to the second set of points. Candidates of the third set of points are selected based on the second region. The signal power of the DUT is evaluated at the candidates of the third set of points to identify a beam peak.

11 Claims, 15 Drawing Sheets

METHOD AND SYSTEM FOR EVALUATING RADIO PERFORMANCE

TECHNICAL FIELD

The disclosure is generally related to a measuring method and a measuring system, and more particularly, related to a measuring method and a measuring system for evaluating radio performance of a radio device.

BACKGROUND

Over-the-air (OTA) measurement is performed to evaluate radio performance of a device under test (DUT) for wireless communication. One issue of the OTA measurement is related to identifying a beam peak direction of directional antenna of the DUT. A testing antenna may be disposed at certain elevation and azimuth angles with respect to the DUT, so as to transmit or receive a testing signal from the DUT. When maximum signal power of the testing signal is observed by the testing antenna, the measuring system may identify the beam peak direction with interested elevation angle and azimuth angle.

To meet regulations of testing scheme as required by the standards or specifications of wireless communication (e.g., the 3GPP, 4G LTE or 5G NR), a resolution of elevation and azimuth angles must be achieved to identify the beam peak direction. For example, a resolution of 7.5 degree of angular interval is required by specification of the 3GPP. However, fine-searching for the beam peak under a resolution of 7.5 degree, which is performed at all measuring points surrounding the DUT, may be significantly time-consuming. Thus, testing time for the DUT to be qualified as a product will be significantly increased, and time-to-market of the product will be therefore degraded.

In view of the above issue of time-consuming testing scheme to identify beam peak, improved measuring method/measuring system for evaluating radio performance of the DUT are therefore desirable, such that huge testing time may be effectively reduced.

SUMMARY

According to one aspect of the disclosure, a method for evaluating radio performance of a device under test (DUT) is provided. The method includes the following steps. Defining a first set of points, a second set of points and a third set of points located on a sphere surrounding the DUT, wherein the second set of points are distributed more densely than the first set of points, and the third set of points are distributed more densely than the second set of points. Evaluating a signal power of the DUT at each point in the first set of points, and identifying a first region related to the first set of points based on the signal power of the DUT. Selecting candidates of the second set of points based on the first region. Evaluating the signal power of the DUT at the candidates of the second set of points, and identifying a second region related to the second set of points based on the evaluation at the candidates of the second set of points. Selecting candidates of the third set of points based on the second region. Evaluating the signal power of the DUT at the candidates of the third set of points, and identifying a beam peak among the third set of points based on based on the evaluation at the candidates of the third set of points.

According to another aspect of the disclosure, a method for evaluating radio performance of a device under test (DUT) is provided. The method includes the following steps. Defining a first set of points located on a sphere surrounding the DUT. Identifying a location of at least one antenna of the DUT. Identifying a first antenna region related to the first set of points based on the location of the at least one antenna of the DUT. Evaluating a signal power of the DUT at the first antenna region. Identifying a beam peak among the first set of points based on the evaluation at the first antenna region.

According to still another aspect of the disclosure, a system for evaluating radio performance of a device under test (DUT) is provided. The system comprises a testing antenna and a processor. The testing antenna is located on at least one point of a first set of points, a second set of points and a third set of points on a sphere surrounding the DUT, wherein the second set of points are distributed more densely than the first set of points, the third set of points are distributed more densely than the second set of points, and the testing antenna is configured to evaluate a signal power of the DUT at each point in the first set of points, evaluate the signal power of the DUT at candidates of the second set of points and evaluate the signal power of the DUT at candidates of the third set of points. The processor is configured to identify a first region related to the first set of points based on the evaluation of the signal power of the DUT at each point in the first set of points, select the candidates of the second set of points based on the first region, identify a second region related to the second set of points based on the evaluation of the signal power of the DUT at the candidates of the second set of points, select the candidates of the third set of points based on the second region, and identify a beam peak among the third set of points based on the evaluation of the signal power of the DUT at the candidates of the third set of points.

Figure 1:
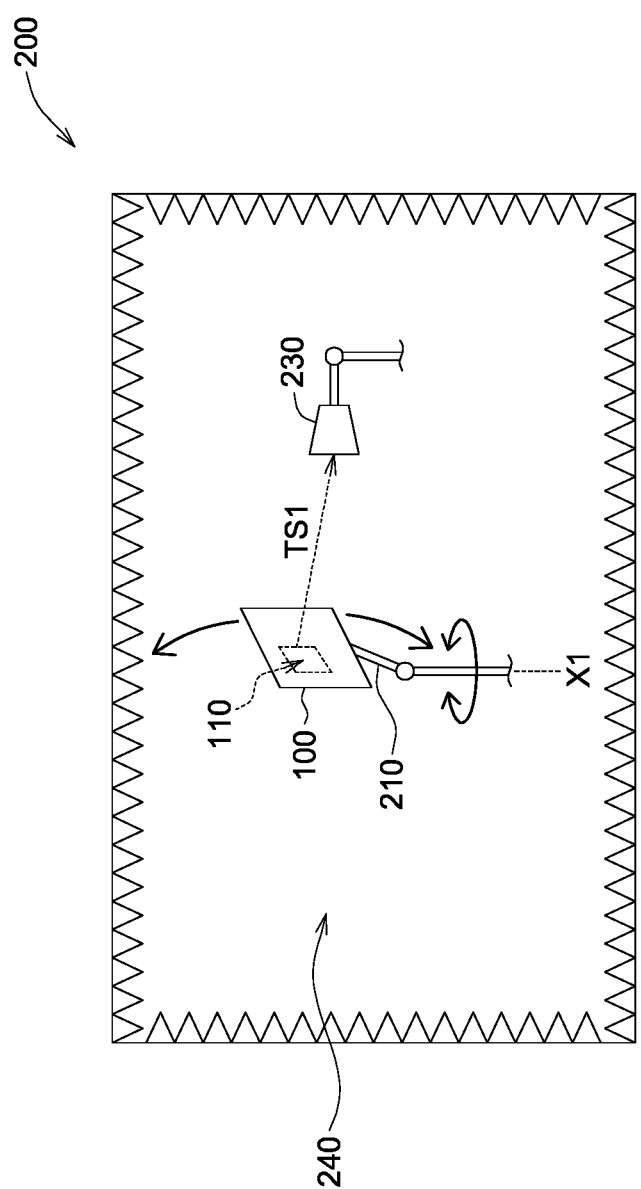
FIG. 1 is a schematic diagram of a measuring system for evaluating radio performance of a device under test (DUT).

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically illustrated in order to simplify the drawing.

DETAILED DESCRIPTION

FIG. 1 is a schematic diagram of a measuring system 200 for evaluating radio performance of a device under test (DUT) 100. Referring to FIG. 1, the measuring system 200 is configured to perform over-the-air (OTA) measurement for evaluating radio performance of the DUT 100. The measuring system 200 includes a positioner 210, a testing antenna 230 and a processor (the processor is not shown). The positioner 210 is used to dispose the DUT 100, the testing antenna 230 is configured to evaluate signal power of the DUT 100, and the processor is configured to perform measuring scheme for radio performance of the DUT 100. The DUT 100, the positioner 210 and the testing antenna 230 are located within an anechoic chamber 240, while the processor may be disposed outside the anechoic chamber 240.

The DUT 100 has at least one antenna 110, e.g., the antenna 110 is a directional antenna. The DUT 100 transmits a testing signal TS1 over the air through the at least one antenna 110. The testing signal TS1 is then received by the testing antenna 230, and the power of the testing signal TS1 is measured to indicate the "signal power" emitted by the DUT 100 through the antenna 110.

The positioner 210 serves to adjust relative position and relative angle between the antenna 110 and testing antenna 230. In one example, the positioner 210 may carry the DUT 100 to rotate along a first axis X1. Furthermore the positioner 210 may carry the DUT 100 to rotate along a second axis (not shown in FIG. 1) perpendicular to the first axis X1.

Figure 2:
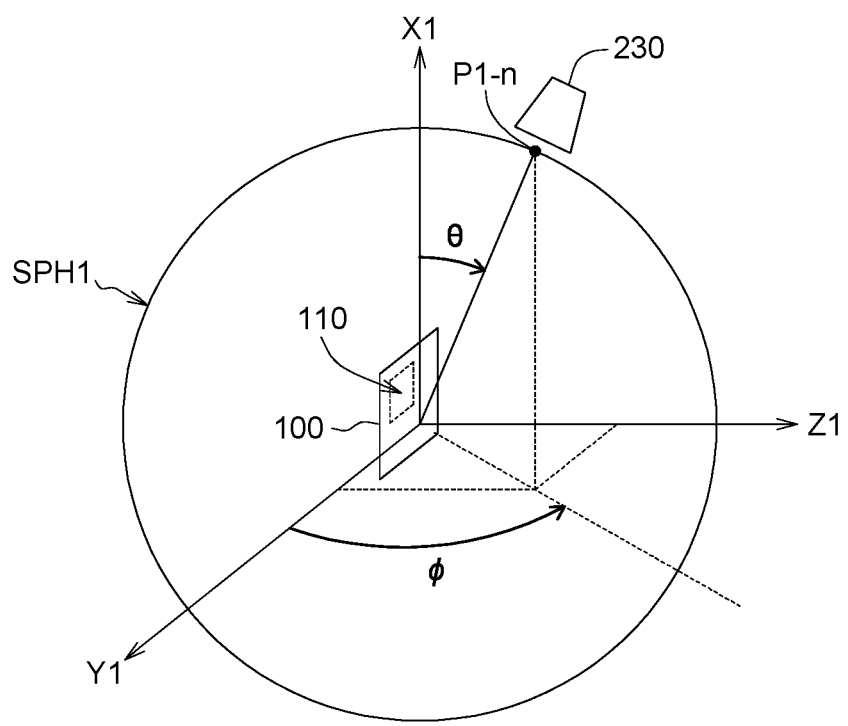
FIG. 2 is a schematic diagram illustrating relative position and relative angle between the DUT and the testing antenna.

FIG. 2 is a schematic diagram illustrating relative position and relative angle between the DUT 100 and the testing antenna 230. Referring to FIG. 2, the DUT 100 is adjusted to align with an azimuth angle $\phi$ with respect to the second axis Y1 and align with an elevation angle $\theta$ with respect to the first axis X1.

A sphere SPH1 is defined as substantially surrounding the DUT 100. The DUT 100 may be deemed as being located at a center of the sphere SPH1. The testing antenna 230 may be deemed as being located on a surface of the sphere SPH1. The positioner 210 of FIG. 1 may carry the DUT 100 to rotate along the second axis Y1, such that the DUT 100 and the testing antenna 230 have a relative elevation angle $\theta$. Furthermore, the positioner 210 may carry the DUT 100 to rotate along the first axis X1, such that the DUT 100 and the testing antenna 230 have a relative azimuth angle $\phi$.

Figure 3A:
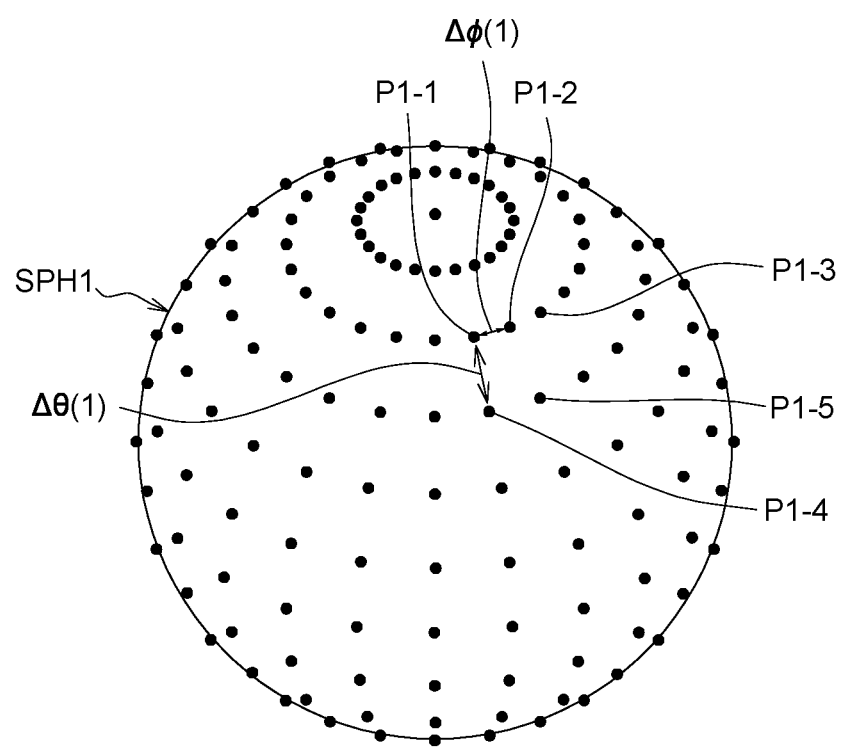
FIG. 3A is a schematic diagram of the first set of points with a spherical view.
Figure 3B:
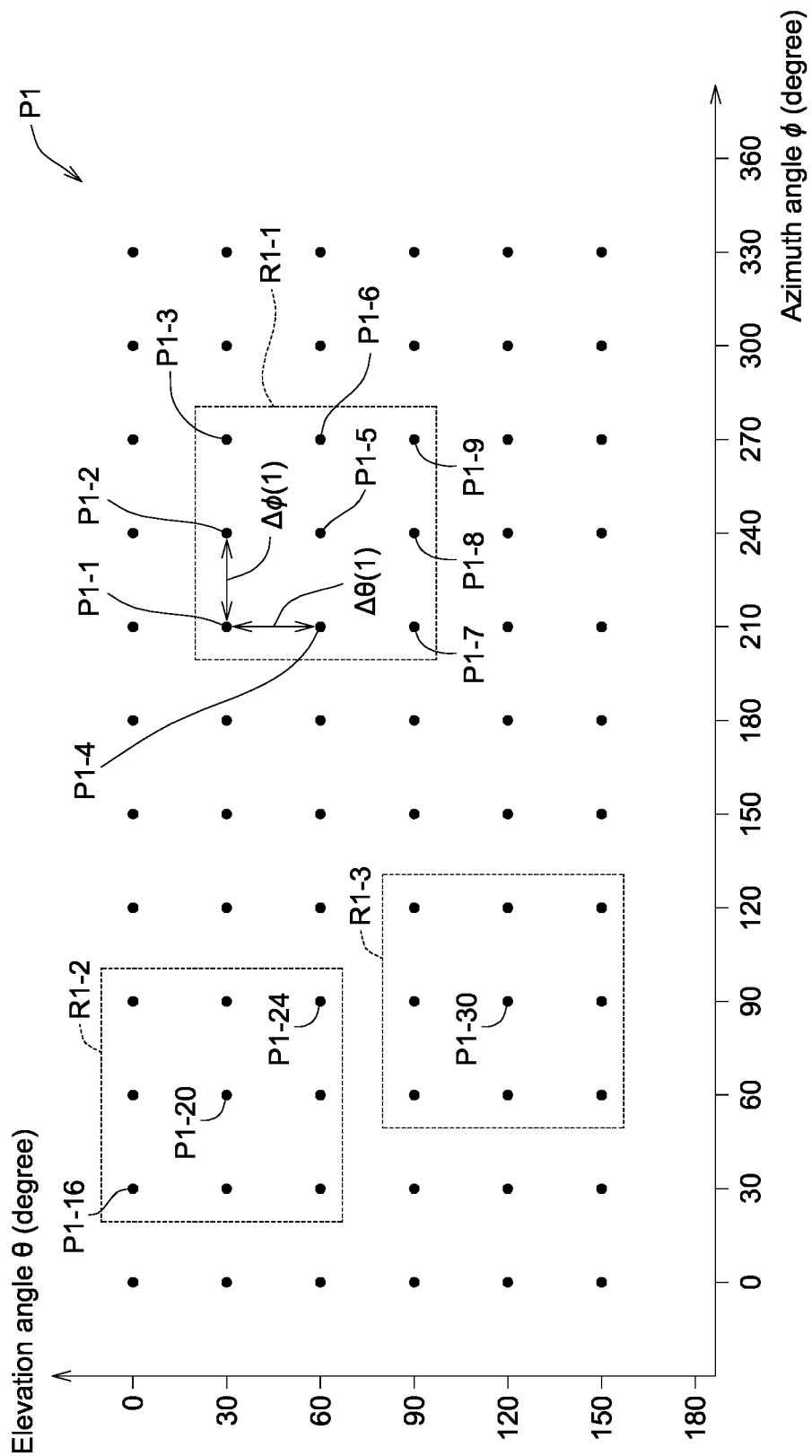
FIG. 3B is a schematic diagram of the first set of points with a plane view.

The testing antenna 230 may be deemed as being disposed at a point P1-n of the surface of the sphere SPH1, with respect to the DUT 100. For different angular values of the elevation angle $\theta$ and the azimuth angle (I), the testing antenna 230 may be deemed as being disposed at different points P1-n, P1-(n+1), P1-(n+2), . . . , etc. (not shown in Figures) of the surface of the sphere SPH1. These points P1-n, P1-(n+1), P1-(n+2), . . . , etc. may form a first set of points P1 on the sphere SPH1. FIG. 3A is a schematic diagrams of the first set of points P1 with a spherical view, and FIG. 3B is a schematic diagram of the first set of points P1 with a plane view. Referring to FIG. 3A, the first set of points P1 are distributed on the sphere SPH1 in a manner of "constant step size" with a sparse density. Each point in the first set of points P1 is taken as a "measuring point" or a "sampling point", and the testing antenna 230 may be deemed as being located on at least one point of the first set of points P1 to perform searching for beam peak direction of the DUT 100. Since the first set of points P1 are distributed on the sphere SPH1 with a sparse density, the testing antenna 230 performs "coarse-searching" for beam peak direction.

For example, when the testing antenna 230 is located at one point P1-1 of the first set of points P1, the testing antenna 230 may measure the power of the testing signal TS1, which indicates the "signal power" of the DUT 100 received at the point P1-1. Then, the testing antenna 230 is located at another point P1-2 of the first set of points P1 to measure the signal power of the DUT 100. Similar scenario is performed at other points P1-3, P1-4, P1-5, . . . , etc. of the first set of points P1.

Then, referring to FIG. 3B, with the distribution manner of "constant step size", the first set of points P1 are spaced from one another by an elevation angular interval $\Delta\theta(1)$ and an azimuth angular interval $\Delta\phi(1)$, where the elevation angular interval $\Delta\theta(1)$ and the azimuth angular interval $\Delta\phi(1)$ have a constant step size. Therefore, the first set of points P1 are uniformly distributed to form "grid points" on the sphere SPH1. In one example, the azimuth angular interval $\Delta\phi(1)$ (e.g., between the point P1-1 and the point P1-2) is 30 degree. Likewise, the elevation angular interval $\Delta\theta(1)$ (e.g., between the point P1-1 and the point P1-4) is also 30 degree. That is, the first set of points P1 are spaced from one another by a first angular interval of 30 degree both in azimuth and elevation with respect to the DUT 100. Given that the elevation angle $\theta$ spans 0 degree to 180 degree, and the azimuth angle $\phi$ spans 0 degree to 360 degree, the first set of points P1 have a total amount of 72 points.

The DUT 100 has a transmitter (TX), and signal power of the DUT 100 may be evaluated by the testing antenna 230 based on an effective isotropic radiated power (EIRP) related to the TX of the DUT 100. The EIRP is obtained at each point in the first set of points P1, at which the testing antenna 230 is located. The EIRP is compared with a first predefined value E1. When the EIRP at some point is greater than the first predefined value E1, this point and its neighboring points are identified as a first region R1-1. For example, EIRP obtained at the point P1-5 is greater than the first predefined value E1, the point P1-5 and its neighboring points P1-1, P1-2, P1-3, P1-4, P1-6, P1-7, P1-8 and P1-9 are identified as the first region R1-1. That is, the point P1-5 itself and its neighboring points (which surround the point P1-5) are identified as the first region R1-1, and great value of EIRP is measured in the first region R1-1.

The antenna 110 may have a beam peak with maximum signal power, and such a beam peak may be possibly located in the first region R1-1. However, the points P1-1-P1-9 of the first region R1-1 are distributed with a sparse density for merely "coarse-searching", which cannot precisely locate the beam peak. Accordingly, it needs to perform "fine-searching" with a denser density of measuring points. As will be discussed in later paragraphs, further defining a second set of points P2 and a third set of points P3, which are distributed on the sphere SPH1 with denser densities, to perform such "fine-searching".

Similarly, when the EIRP at another point is greater than the first predefined value E1, this point and its neighboring points are identified as another first region R1-2. For example, EIRP obtained at another point P1-20 is greater than the first predefined value E1, this point P1-20 and its neighboring points P1-16~P1-24 are identified as the first region R1-2. Then, fine-searching for the beam peak will be performed based on the first region R1-2.

Likewise, when the EIRP at still another point is greater than the first predefined value E1, this point and its neighboring points are identified as another first region R1-3. For example, EIRP obtained at another point P1-30 is greater than the first predefined value E1, this point P1-30 and its neighboring points are identified as the first region R1-3, and fine-searching for the beam peak will be performed based on the first region R1-3.

The evaluation and comparison of EIRP and the identification of the first region R1-1, the first region R1-2 and the first region R1-3 as mentioned above, may be performed by the processor of the measuring system 200.

Figure 4A:
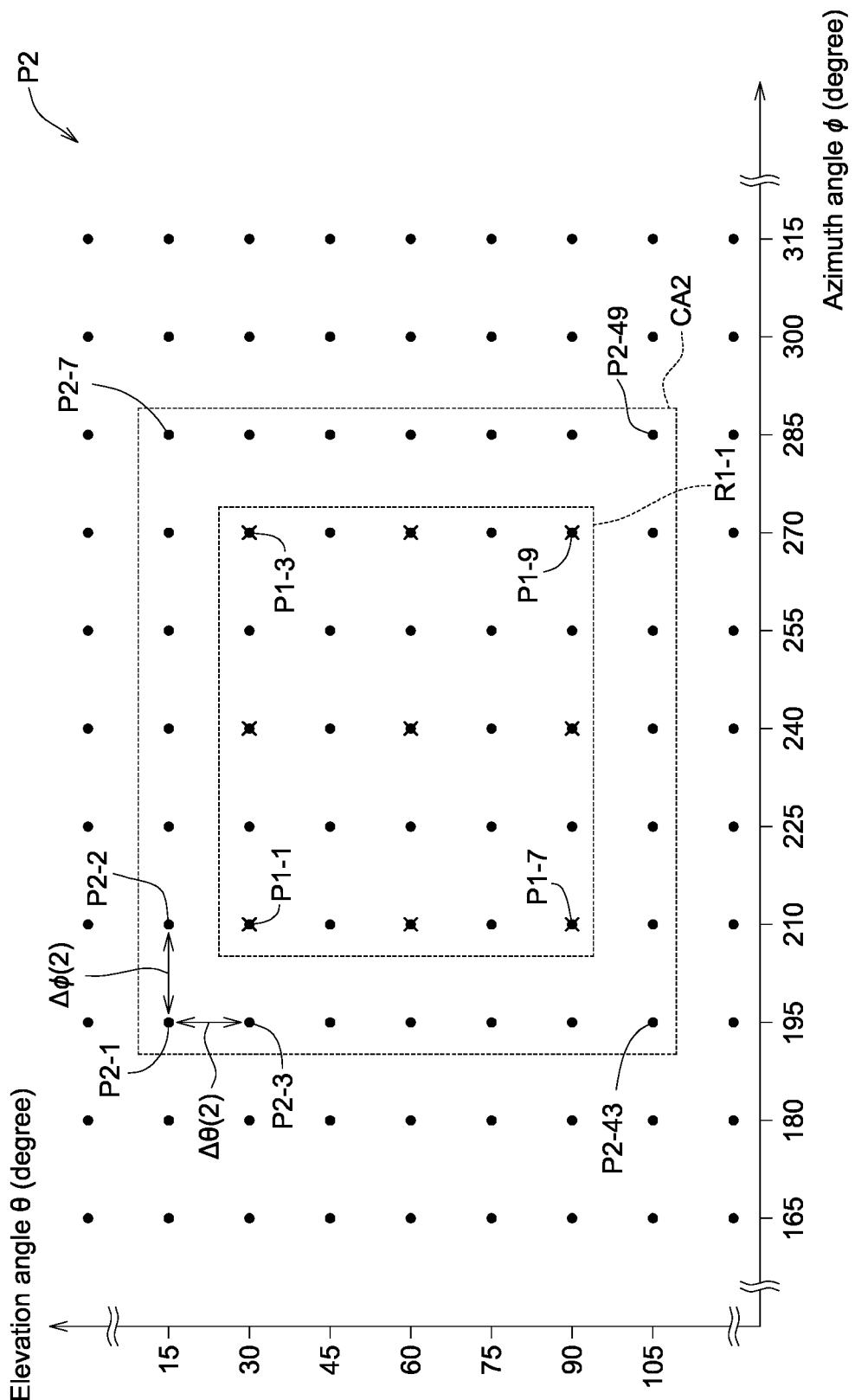
FIGS. 4A and 4B are schematic diagrams of the second set of points with a plane view.
Figure 4B:
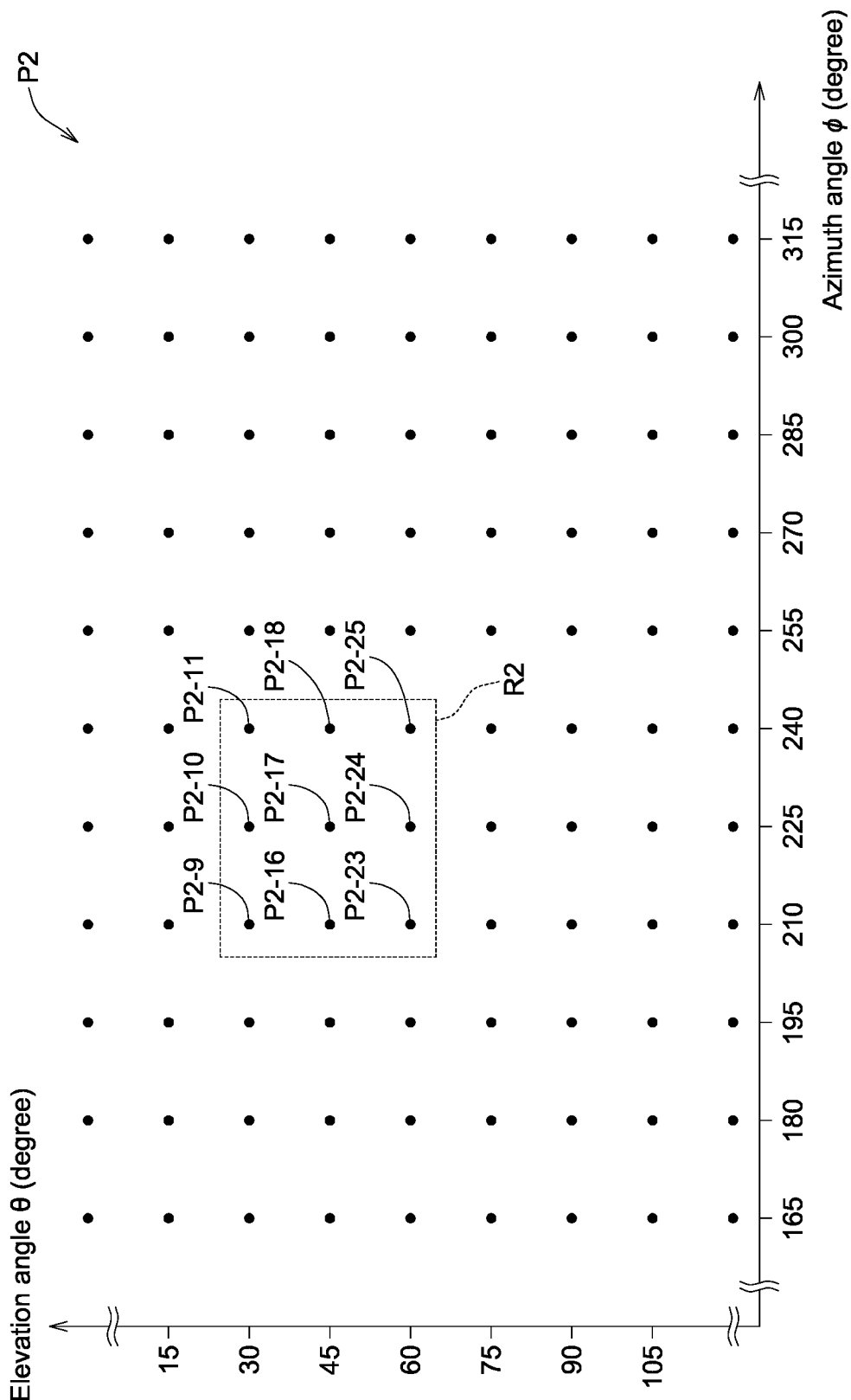

FIGS. 4A and 4B are schematic diagrams of the second set of points P2 with a plane view. Referring to FIG. 4A, the second set of points P2 are distributed on the sphere SPH1 in a manner of "constant step size". The second set of points P2 are distributed more densely than the first set of points P1. The second set of points P2 are spaced from one another by an elevation angular interval $\Delta\theta(2)$ and an azimuth angular interval $\Delta\phi(2)$, where the elevation angular interval $\Delta\theta(2)$ and the azimuth angular interval $\Delta\phi(2)$ have a constant step size of 15 degree. That is, the second set of points P2 are spaced from one another by a second angular interval of 15 degree both in azimuth and elevation with respect to the DUT 100. Given the second angular interval of 15 degree, the second set of points P2 have a total amount of 288 points on the sphere SPH1. For simplicity, FIG. 4A merely shows a part of the second set of points P2.

Some of the second set of points P2 may overlap the first set of points P1, and some of the second set of points P2 may be located between the first set of points P1. The points P2-1, P2-2, P2-7, . . . , P2-43, . . . , P2-49 of the second set of points P2 surround the first region R1-1 of the first set of points P1. An amount of 49-points (i.e., P2-1~P2-49) of the second set of points P2, which are surrounding or located within the first region R1-1, are selected as candidates CA2. The testing antenna 230 is located on at least one point of the second set of points P2 to perform fine-searching for beam peak direction of the DUT 100. In this embodiment of the disclosure, the testing antenna 230 is located on each point of the candidates CA2 to perform fine-searching for beam peak.

In one example, EIRP related to the TX of the DUT 100 is measured at each point of the candidates CA2. No need to measure EIRP at other points than the candidates CA2. Then, the measured EIRPs at the candidates CA2 are compared with a first predefined value E1. When EIRP at some point of the candidates CA2 is greater than the first predefined value E1, this point and its neighboring points are identified as a second region R2. For example, referring to FIG. 4B, among the candidates CA2, the point P2-17 has EIRP greater than the first predefined value E1. This point P2-17 and its neighboring points P2-9, P2-10, P2-11, P2-16, P2-18, P2-23, P2-24 and P2-25 are identified as the second region R2. It's indicated that, beam peak may be possibly located in the second region R2, and further "fine-searching" will be performed according to the second region R2. Further "fine-searching" will be performed at the third set of points P3 as shown in FIG. 5.

Similarly, regarding other first regions R1-2 and R1-3 of the first set of points P1 in FIG. 3B, candidates of the second set of points P2 are selected. That is, some points of the second set of points P2 surrounding or located within the other first regions R1-2 and R1-3 are selected as candidates (not shown in FIGS. 4A and 4B). These candidates related to other first regions R1-2 and R1-3 are used to perform fine-searching for beam peak.

Figure 5:
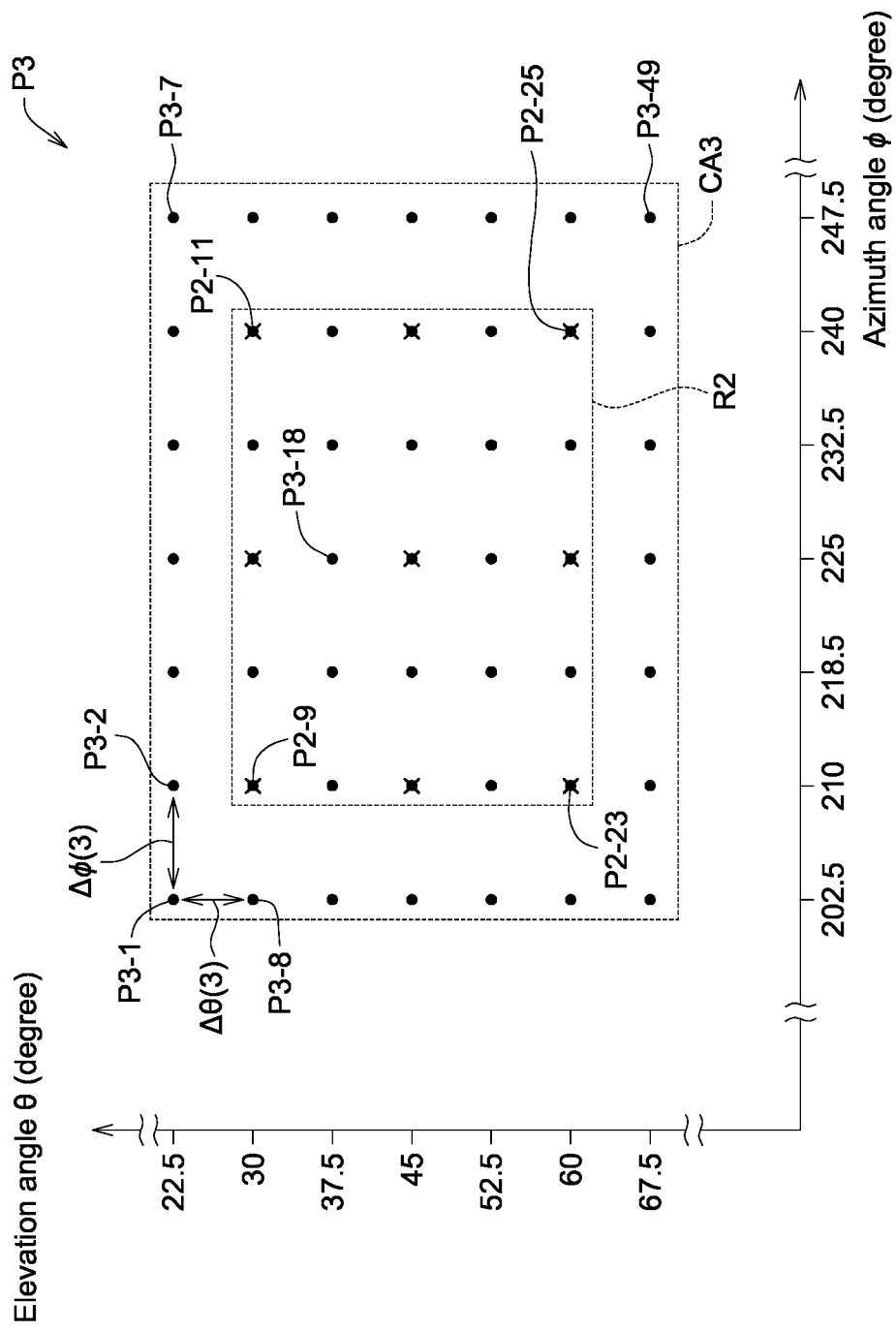
FIG. 5 is a schematic diagram of the third set of points with a plane view.

FIG. 5 is a schematic diagram of the third set of points P3 with a plane view. Referring to FIG. 5, the third set of points P3 are distributed on the sphere SPH1 in a manner of "constant step size", where the third set of points P3 are distributed more densely than the first set of points P1 and the second set of points P2. In one example, the third set of points P3 are spaced from one another by an elevation angular interval $\Delta\theta(3)$ and an azimuth angular interval $\Delta\phi(3)$ with a constant step size of 7.5 degree. That is, the third set of points P3 are spaced from one another by a third angular interval of 7.5 degree, hence the third set of points P3 totally have 1106 points on the sphere SPH1. In this example, the first angular interval (e.g., 30 degree) of the first set of points P1 is M-multiples of the second angular interval (e.g., 15 degree) of the second set of points P2. Furthermore, the second angular interval is N-multiples of the third angular interval (e.g., 7.5 degree) of the third set of points P3. N and M are positive integers (e.g., N=2 and M=2).

Some points of the third set of points P3 located within or surrounding the second region R2 may be selected as candidates CA3. For example, the points P3-1, P3-2, . . . , P3-7, . . . , P3-49 fall within or surround the second region R2, hence these points P3-1, P3-2, . . . , P3-7, . . . , P3-49 are selected as candidates CA3. Then, further fine-searching for the beam peak is performed at the candidates CA3. That is, the testing antenna 230 is located on each point of the candidates CA3 to perform fine-searching for the beam peak. In one example, EIRP is measured at each point of the candidates CA3 (i.e., no need to measure EIRP at other points of the third set of points P3 than the candidates CA3), and the point in the candidates CA3 with a maximum value of EIRP is identified as the beam peak. Such as, the point P3-18 has a maximum value of EIRP, and such a point P3-18 is identified as the beam peak.

The identification of the second region R2, the candidates CA2 and the candidates CA3 as mentioned above, may be performed by the processor of the measuring system 200.

In the examples of FIGS. 3B, 4A, 4B and 5, the first angular interval (e.g., 30 degree) of the first set of points P1 is 2-multiples of the second angular interval (e.g., 15 degree) of the second set of points P2. Furthermore, the second angular interval is 2-multiples of the third angular interval (e.g., 7.5 degree) of the third set of points P3. In other examples (not shown), the N and M multiples between the first, second and third angular intervals may be other integers. For example, M=4 and N=2, or, M=2 and N=3, etc.

In the aforementioned example, signal power of the DUT 100 is evaluated based on EIRP related to the TX of the DUT 100. In another example, signal power of the DUT 100 may be evaluated based on effective isotropic sensitivity (EIS) related to the receiver (RX) of the DUT 100. In this case, at each point of the first set of points P1, EIS is measured and then compared with a second predefined value E2. When, at some points of the first set of points P1 the EIS are lower than the second predefined value E2, these points are identified as a first region R1-1.

Then, for the points of the second set of points P2, those located within or surrounding the first region R1-1 are selected as the candidates CA2. Then, EIS is measured at each point of the candidates CA2, and the measured EIS is compared with the second predefined value E2. The points with measured EIS lower than the second predefined value E2 are identified as a second region R2. The above schemes may be applied to other first regions R1-2 and R1-3 of FIG. 3B.

Thereafter, some of the third set of points P3 which locate within or surround the second region R2, are selected as the candidates CA3. EIS is measured at each point of the candidates CA3, and the point with a minimum value of EIS is identified as the beam peak.

The evaluation and comparison of EIS and the identification of the first regions R1-1, R1-2 and R1-3, the second region R2, the candidates CA2 and the candidates CA3 as mentioned above, may be performed by the processor of the measuring system 200.

Figure 6A:
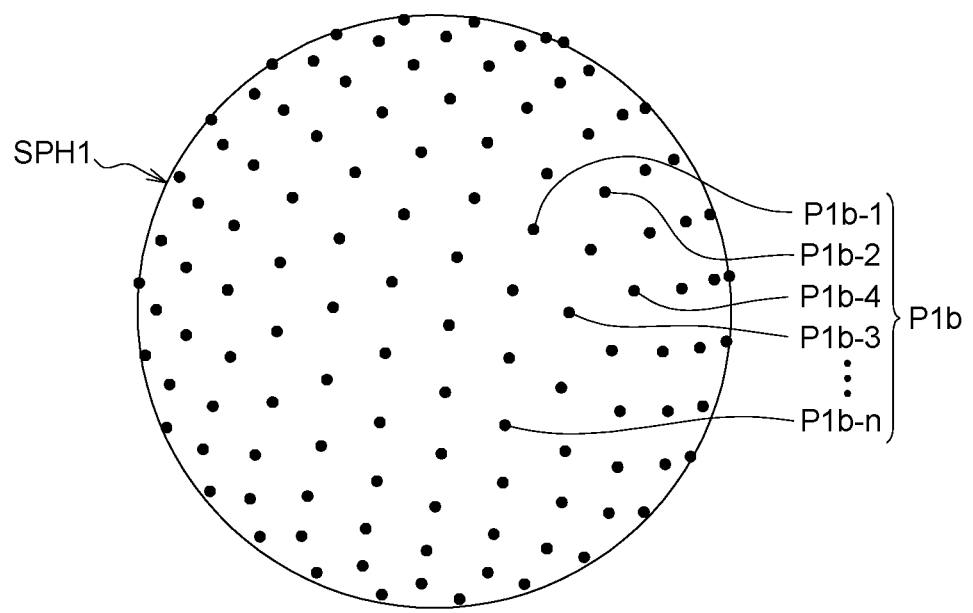
FIGS. 6A and 6B are schematic diagrams illustrating another example of distribution manner of the first set of points.
Figure 6B:
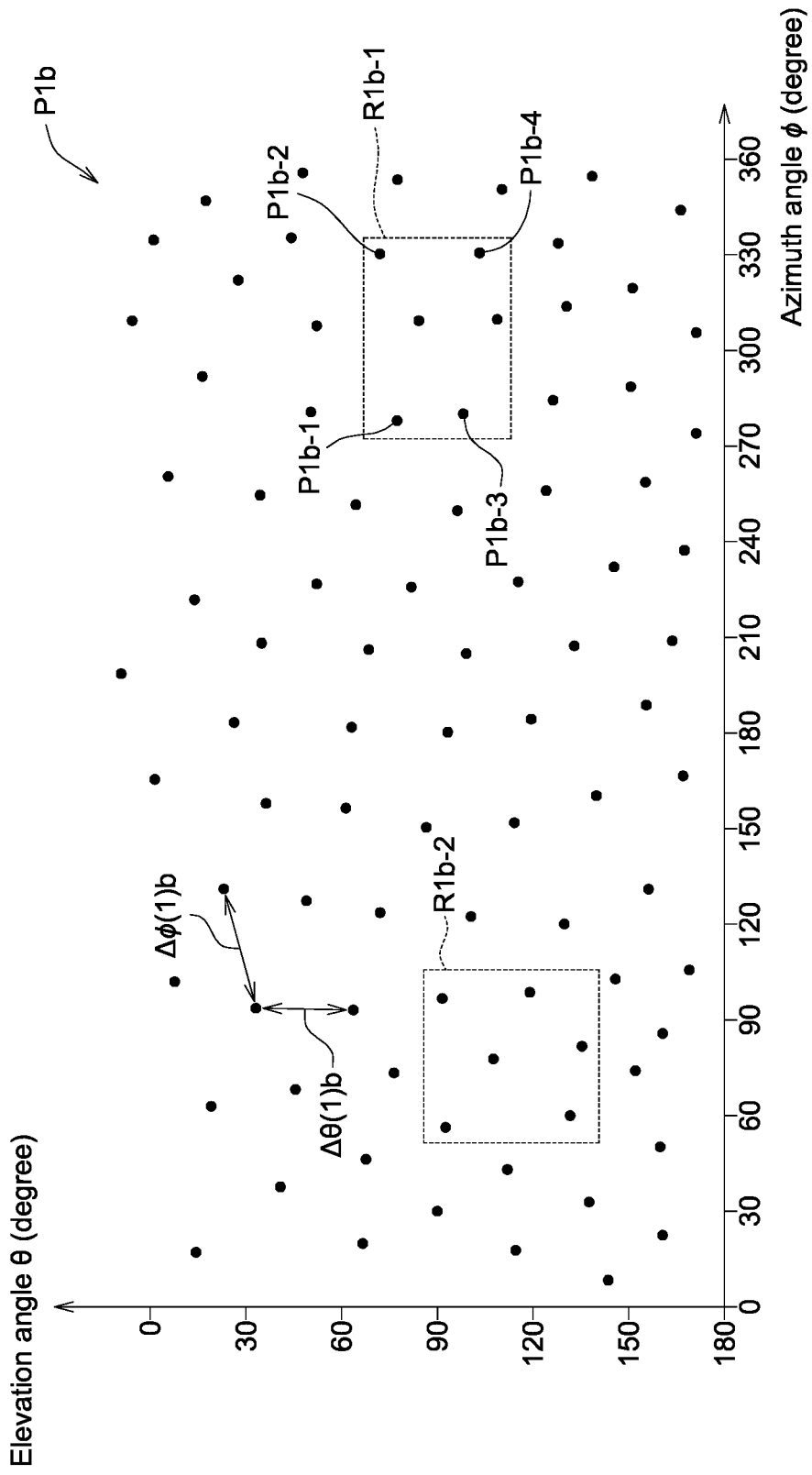

FIGS. 6A and 6B are schematic diagrams illustrating another example of distribution manner of the first set of points P1b. Referring to FIGS. 6A and 6B, the first set of points P1b are distributed on the sphere SPH1 in a manner of "constant density". Unlike the distribution manner of the first set of points P1 of FIGS. 3A and 3B, for the first set of points P1b of FIGS. 6A and 6B, the angular interval between adjacent two points does not have constant step size. Instead, the elevation angle θ and azimuth angle φ of each point of the first set of points P1b comply with distribution functions of constant density F1{θ(1b)} and F2{φ(1b)}, so that the first set of points P1b are distributed on the sphere SPH1 with uniform density. The first set of points P1b have an amount of K1 points in total.

Figure 6C:
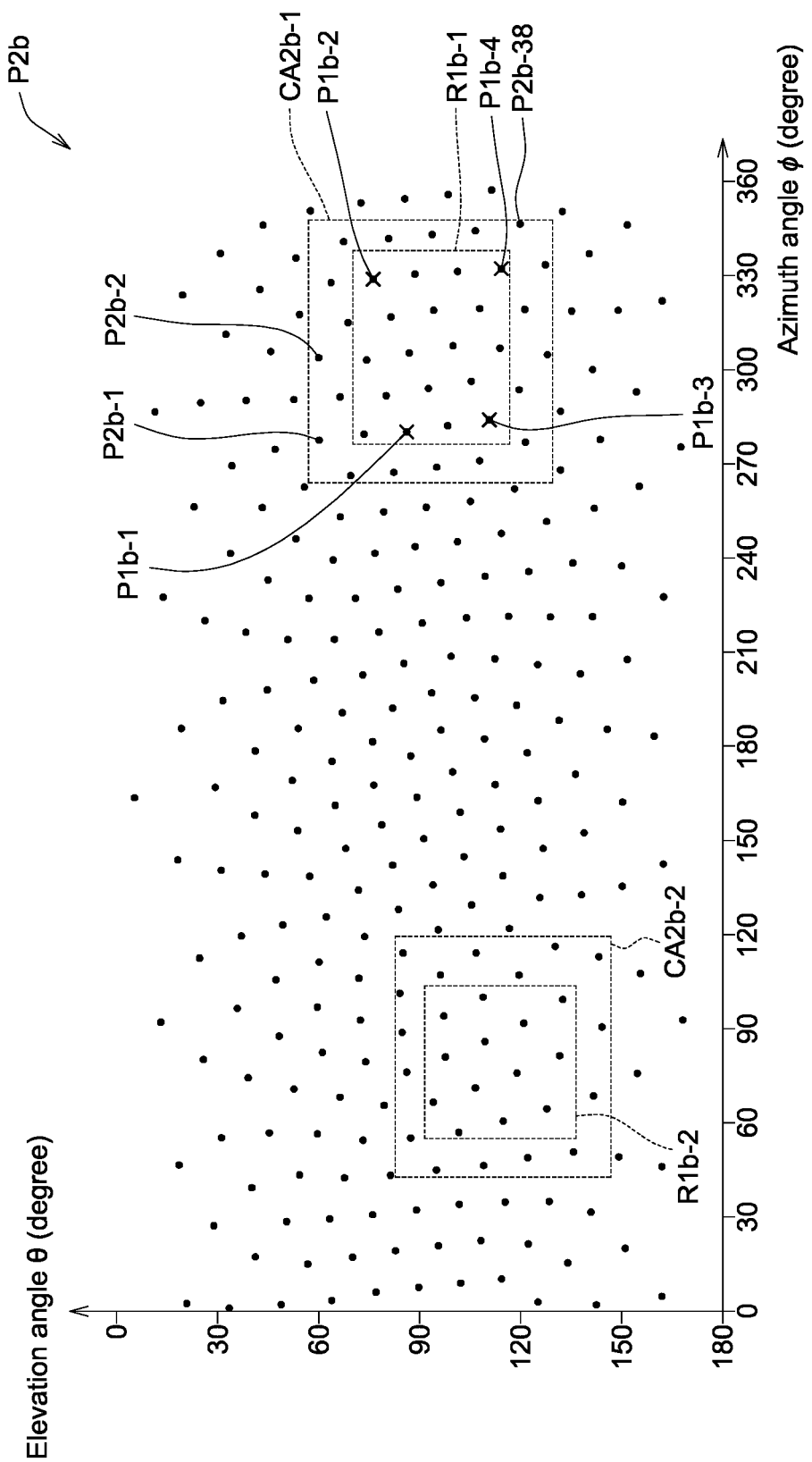
FIG. 6C is a schematic diagram illustrating another example of distribution manner of the second set of points.

FIG. 6C is a schematic diagram illustrating another example of distribution manner of the second set of points P2b. Referring to FIG. 6C, the second set of points P2b are also distributed in a manner of "constant density". In one example, the second set of points P2b may be distributed more densely than the first set of points P1b, such that the second set of points P2b are used for fine-searching of the beam peak. Such as, the second set of points P2b have an amount of K2 points in total, and the amount K2 of the second set of points P2b may be greater than the amount K1 of the first set of points P1b, which means, the distribution density of the second set of points P2b may be greater than that of the first set of points P1b.

Similarly, a third set of points P3b (not shown) is defined on the sphere SPH1 to further fine-search the beam peak. The third set of points P3b are also distributed in a manner of "constant density" as the first and second sets of points P1b and P2b. In one example, the third set of points P3b may be distributed more densely than the first and second sets of points P1b and P2b, so that the third set of points P3b are used to perform further fine-searching of the beam peak. Such as, the third set of points P3b have an amount of K3 points in total, and the amount K3 of the third set of points P3b may be greater than the amount K2 of the second set of points P2b and the amount K1 of the first set of points P1b, which means, the distribution density of the third set of points P3b may be greater than those of the second set of points P2b and the first set of points P1b.

The searching scenario for locating beam peak as applied to the example of FIGS. 3B, 4A, 4B and 5 with "constant step size" distribution of points P1, P2 and P3, may be similarly applied to the example of FIGS. 6B and 6C with "constant density" distribution of points P1b, P2b and P3b. Such searching scenario may be performed by the processor of the measuring system 200.

Referring to FIG. 6B, EIRP or EIS is measured at each point in the first set of points P1b. EIRP greater than predefined value or EIS lower than predefined value are obtained at points P1b-1, P1b-2, P1b-3 and P1b-4 of the first set of points P1, and these points P1b-1, P1b-2, P1b-3 and P1b-4 are identified as the first region R1b-1. Similarly, some other points of the first set of points P1b, with EIRP greater than predefined value or EIS lower than predefined value, are identified as another first region R1b-2.

Then, referring to FIG. 6C, those of the second set of points P2b locating within or surrounding the first region R1b-1 are selected as candidates CA2b-1. For example, an amount of 38 points P2b-1, P2b-2, . . . , P2b-38 of the second set of points P2b are selected as the candidates CA2b-1. Then, EIRP or EIS is measured at each point of the candidates CA2b-1. Furthermore, when some points of the candidates CA2b-1 are measured having EIRP greater than predefined value or EIS lower than predefined value, these points are identified as the second region R2b (not shown).

Likewise, for the third set of points P3b (not shown), those falling within or surrounding the second region R2b are selected as candidates CA3b (not shown). Then, EIRP or EIS is measured at each point in the candidates CA3b. When one point in the candidates CA3b is measured having the maximum EIRP or the minimum EIS, such a point is identified as the beam peak.

Similarly, in FIG. 6C, those of the second set of points P2b locating within or surrounding another first region R1b-2 are selected as candidates CA2b-2. The candidates CA2b-2 are used to perform fine-searching for beam peak.

Figure 7A:
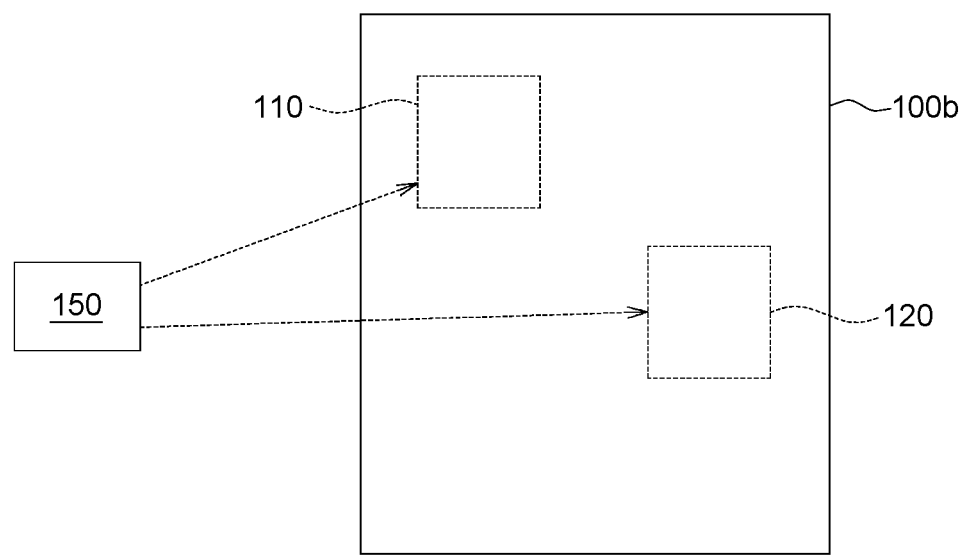
FIG. 7A is a schematic diagram of another example of the DUT.

FIG. 7A is a schematic diagram of another example of the DUT 100b. As shown in FIG. 7A, the DUT 100b has more than one antenna, such as, two antennas 110 and 120. Locations of the antennas 110 and 120 may be identified by a detecting device 150. The detecting device 150 is, for example, an infrared thermography or an X-ray scope. The detecting device 150 may assist to identify location of antennas 110 and 120 before searching beam peak is performed.

Figure 7B:
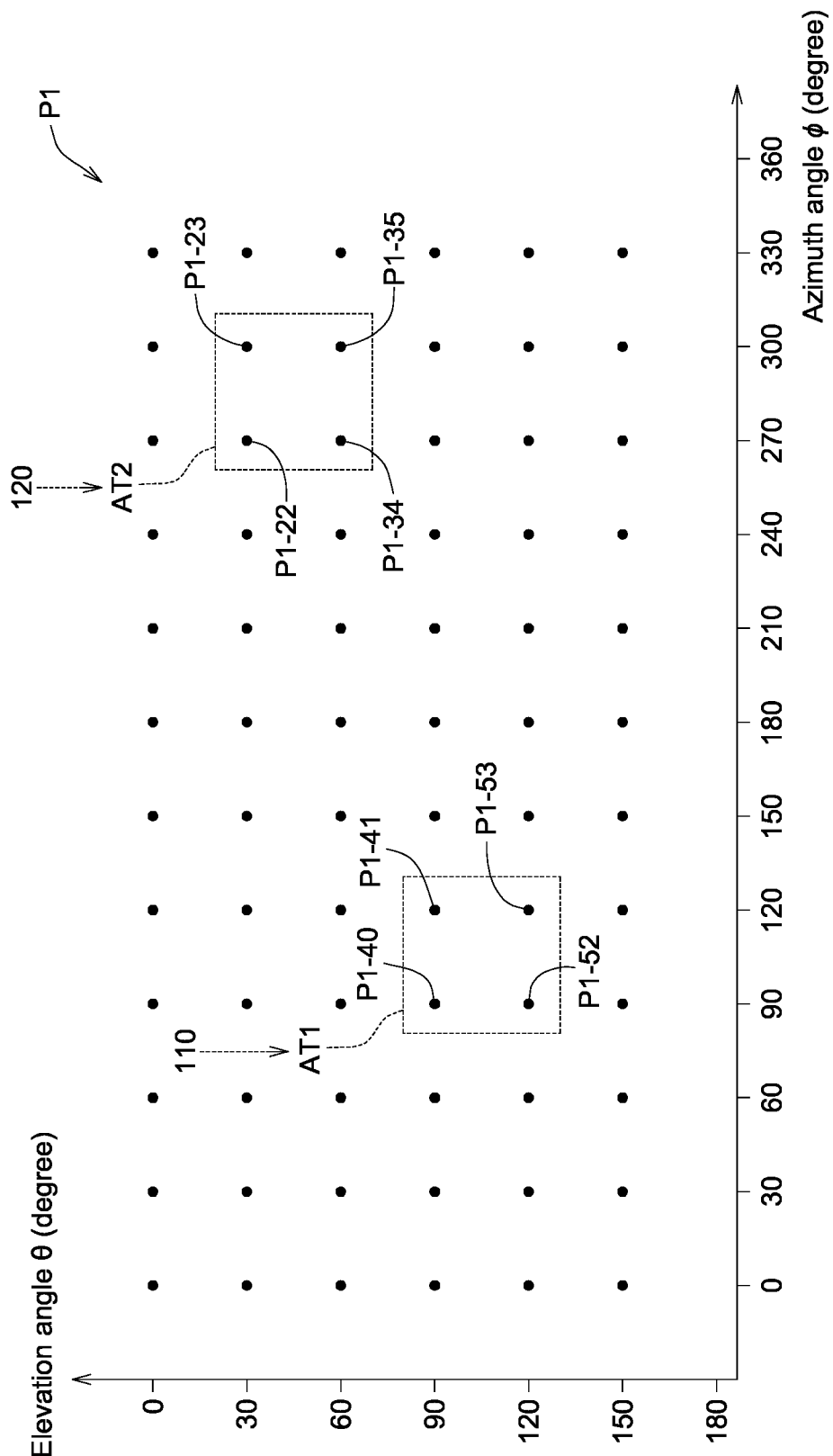
FIGS. 7B and 8 are schematic diagrams of the first set of points and the second set of points, with another example of searching scenario applied to the DUT of FIG. 7A.
Figure 8:
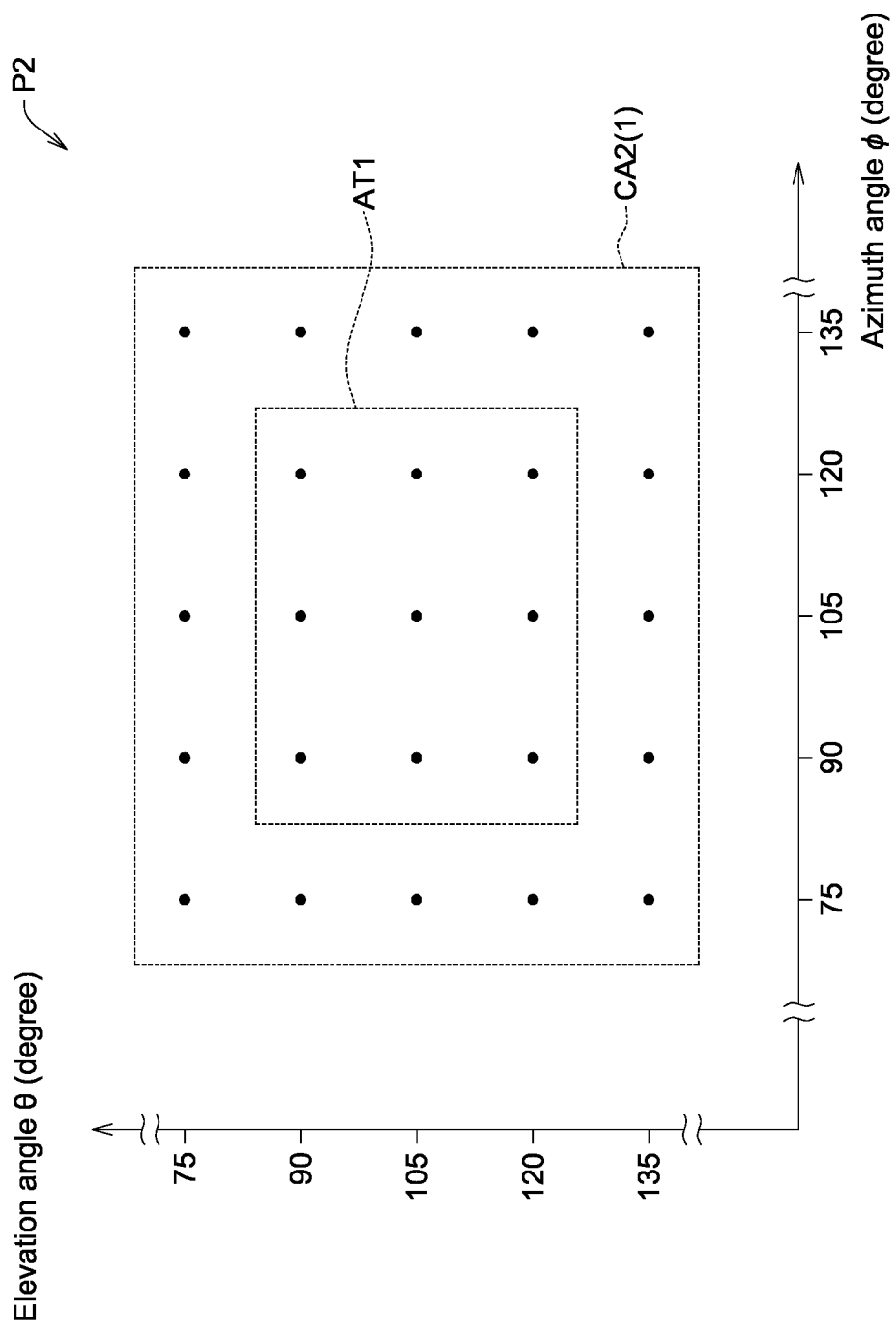

FIGS. 7B and 8 are schematic diagrams of the first set of points P1 and the second set of points P2, with another example of searching scenario applied to the DUT 100b of FIG. 7A. In this example of searching scenario, locations of the antennas 110 and 120 of the DUT 100b of FIG. 7A are identified in advance (before searching), so as to speed up beam peak searching.

As shown in FIG. 7B, according to the locations of antennas 110 and 120, some points of the first set of points P1 may be identified as being related to antennas 110 and 120. For example, according to the location of antenna 110, related points P1-40, P1-41, P1-52 and P1-53 are identified as a first antenna region AT1. Greater signal power of antenna 110 may be measured in the first antenna region AT1. Likewise, according to the location of another antenna 120, related points P1-22, P1-23, P1-34 and P1-35 are identified as a second antenna region AT2. Greater signal power of antenna 120 may be measured in the second antenna region AT2. Then, fine-searching will be performed based on the first antenna region AT1 and the second antenna region AT2.

Referring to FIG. 8, taking the first antenna region AT1 related to the antenna 110 as an example to describe fine-searching. Such fine-searching, as discussed in the following paragraphs, may be performed by the processor of the measuring system 200. First of all, some points in the second set of points which fall within or surround the first antenna region AT1, may be selected as candidates CA2(1). Then, signal power of the DUT 100b is evaluated based on EIRP or EIS at candidates CA2(1). Then, one point of candidate CA2(1) with the greatest EIRP or lowest EIS is identified as the beam peak for the antenna 110.

Likewise, for another antenna 120, some of the second set of points which fall within or surround the second antenna region AT2 may be selected as candidates (not shown in FIG. 8). Then, EIRP or EIS is evaluated at the candidates to determine the beam peak for the antenna 120.

In the example of FIGS. 7B and 8, the first and second set of points P1 and P2 are distributed on the sphere SPH1 in a manner of "constant step size", where the second set of points P2 have a distribution more dense than the first set of points P1. Such as, the first set of points P1 has a first angular interval of 30 degree between two adjacent points, and the second set of points P2 has a second angular interval of 15 degree. In other examples, the first and second set of points P1 and P2 may be distributed in a manner of "constant density".

Figure 9:
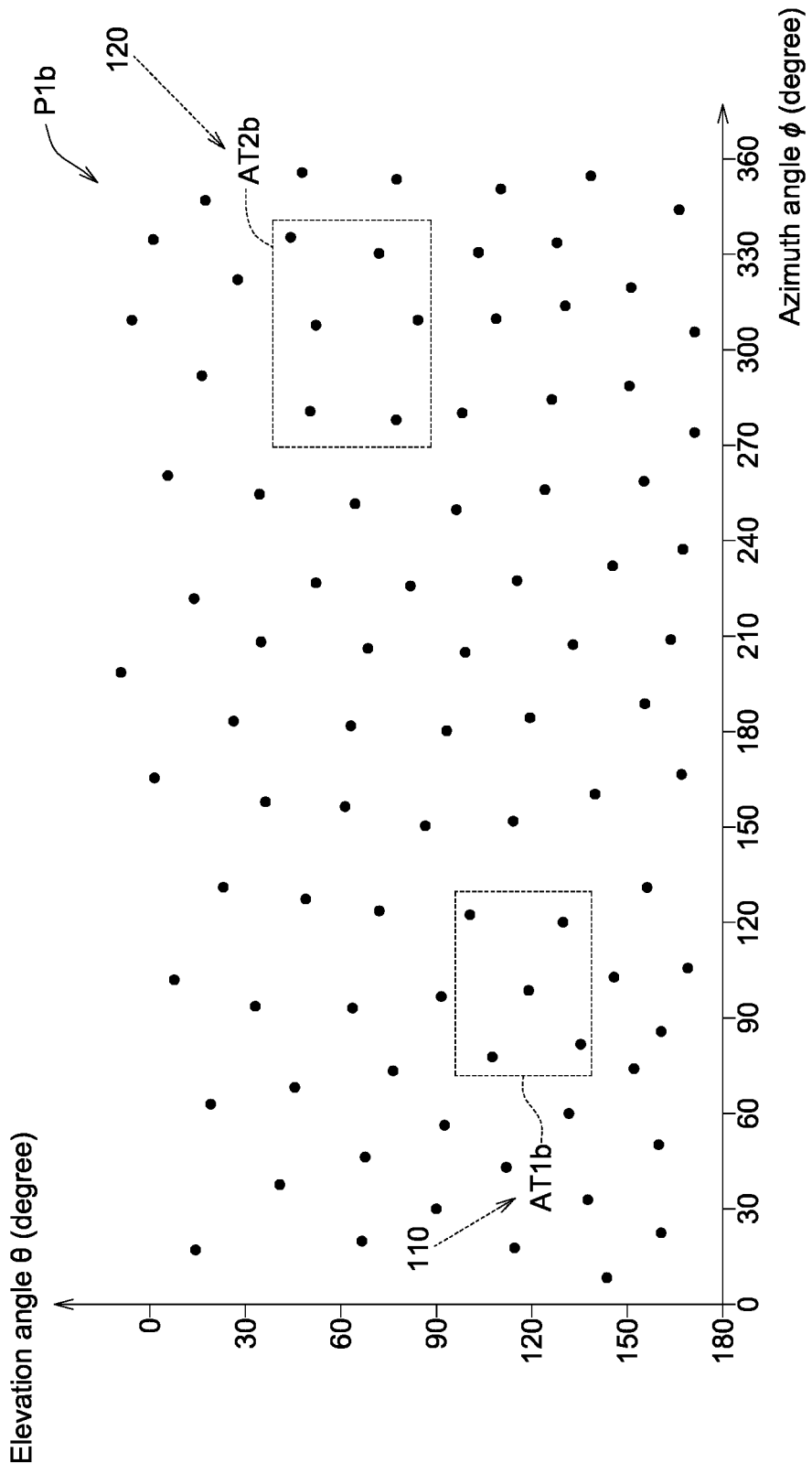
FIGS. 9 and 10 are schematic diagrams of the first set of points and the second set of points with distribution of "constant density", with another example of searching scenario.
Figure 10:
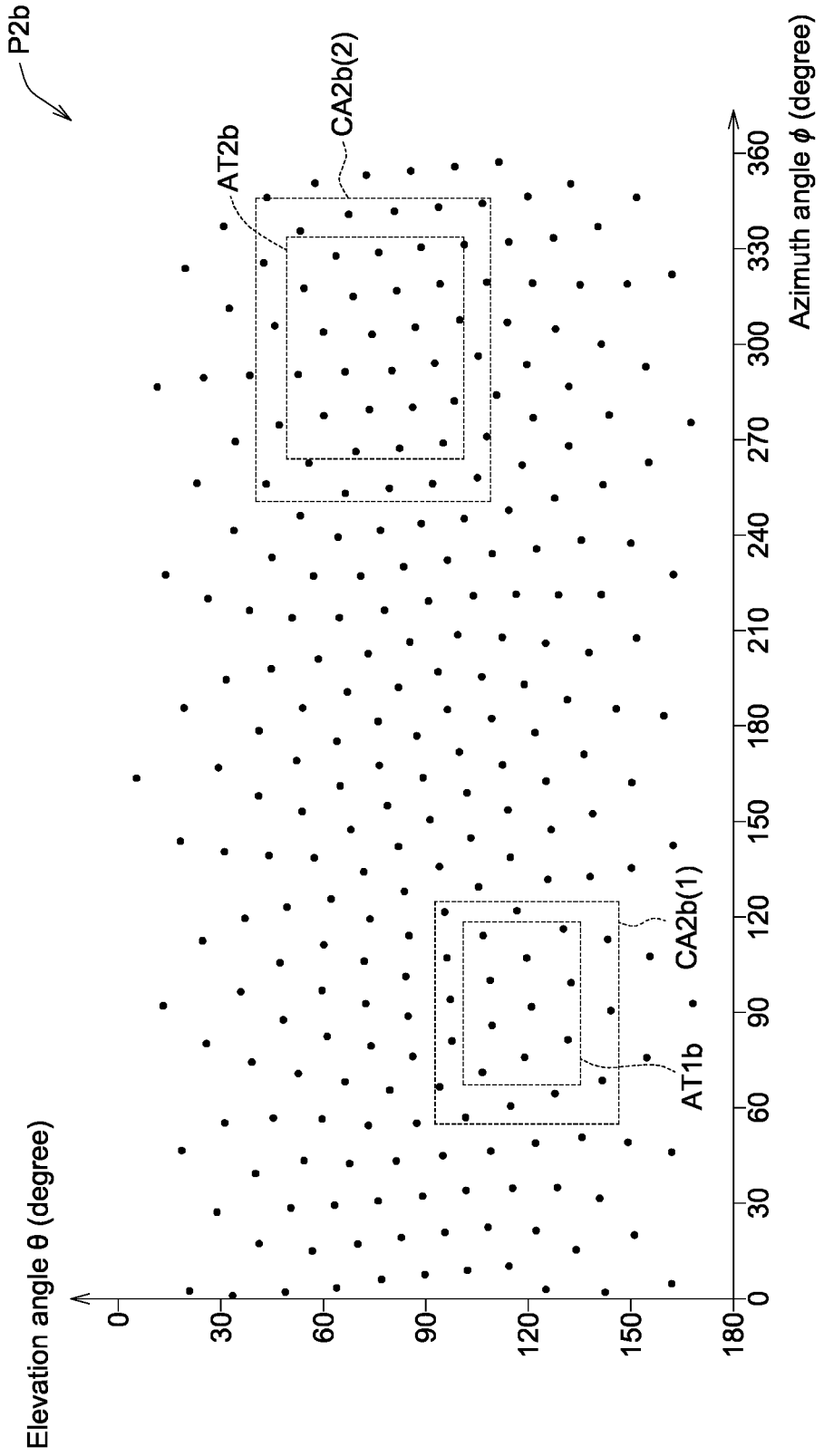

FIGS. 9 and 10 are schematic diagrams of the first set of points P1b and the second set of points P2b with distribution of "constant density", with another example of searching scenario based on location of antennas 110 and 120 of the DUT 100b. In one example, the second set of points P2b may have an amount K2 greater than the amount K1 of the first set of points P1b, that is, the second set of points P2b may be more densely than the first set of points P1b.

As shown in FIG. 9, a first antenna region AT1b may be identified based on the location of the antenna 110. Likewise, a second antenna region AT2b may be identified based on the location of another antenna 120.

Then, referring to FIG. 10, candidates CA2b(1) are selected based on the first antenna region AT1b. EIS or EIRP is measured at candidates CA2b(1) to identify beam peak of the antenna 110. Likewise, candidates CA2b(2) are selected based on the second antenna region AT2b, and beam peak of the antenna 120 is identified among the candidates CA2b(2).

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A method for evaluating radio performance of a device under test (DUT), comprising:
defining a first set of points located on a sphere surrounding the DUT;
identifying a location of at least one antenna of the DUT by using an infrared thermography or a X-ray scope;
identifying a first antenna region related to the first set of points based on the location of the at least one antenna of the DUT; and
evaluating a signal power of the DUT at the first antenna region, and identifying a beam peak among the first set of points based on the evaluation at the first antenna region.

2. The method according to claim 1, wherein:
the beam peak is identified by at least one of points in the first antenna region, which has effective isotropic radiated power (EIRP) with a maximum value or effective isotropic sensitivity (EIS) with a minimum value.

3. The method according to claim 2, further comprising:
defining a second set of points located on the sphere surrounding the DUT, wherein the second set of points are distributed more densely than the first set of points;
selecting candidates of the second set of points based on the first antenna region;
evaluating the signal power of the DUT at the candidates of the second set of points; and
identifying the beam peak among the second set of points based on the evaluation at the candidates of the second set of points,
wherein the beam peak is identified by at least one of points in the candidates of the second set of points, which has EIRP with a maximum value or EIS with a minimum value.

4. The method according to claim 3, wherein:
the first set of points are spaced by a first angular interval, the second set of points are spaced by a second angular interval; and
the first angular interval is M-multiples of the second angular interval, M is a positive integer.

5. The method according to claim 3, wherein:
azimuth angles and elevation angles of the first set of points and the second set of points with respect to the DUT comply with distribution functions of constant density; or
the amount of the second set of points is greater than the amount of the first set of points.

6. A system for evaluating radio performance of a device under test (DUT), comprising:
a testing antenna, being located on at least one point of a first set of points, a second set of points and a third set of points on a sphere surrounding the DUT, wherein the second set of points are distributed more densely than the first set of points, the third set of points are distributed more densely than the second set of points, and the testing antenna is configured to evaluate a signal power of the DUT at each point in the first set of points, evaluate the signal power of the DUT at candidates of the second set of points and evaluate the signal power of the DUT at candidates of the third set of points; and
a processor, configured to identify a first region related to the first set of points based on the evaluation of the signal power of the DUT at each point in the first set of points, select the candidates of the second set of points based on the first region, identify a second region related to the second set of points based on the evaluation of the signal power of the DUT at the candidates of the second set of points, select the candidates of the third set of points based on the second region, and identify a beam peak among the third set of points based on the evaluation of the signal power of the DUT at the candidates of the third set of points.

7. The system according to claim 6, wherein:
the first set of points are spaced by a first angular interval, the second set of points are spaced by a second angular interval, and the third set of points are spaced by a third angular interval; and
the second angular interval is N-multiples of the third angular interval, and the first angular interval is M-multiples of the third angular interval, N and M are positive integers.

8. The system according to claim 6, wherein:
azimuth angles and elevation angles of the first set of points, the second set of points and the third set of points with respect to the DUT comply with distribution functions of constant density; or
the amount of the third set of points is greater than the amount of the second set of points, and the amount of the second set of points is greater than the amount of the first set of points.

9. The system according to claim 6, wherein:
the candidates of the second set of points are located within or surrounding the first region of the first set of points; or
the candidates of the third set of points are located within or surrounding the second region of the second set of points.

10. The system according to claim 6, wherein the processor is configured to identify the first region by points in the first set of points, which have effective isotropic radiated power (EIRP) greater than a first predefined value or have effective isotropic sensitivity (EIS) lower than a second predefined value, and identify the second region by the candidates of the second set of points, which have EIRP greater than the first predefined value or have EIS lower than the second predefined value.

11. The system according to claim 10, wherein the processor is configured to identify the beam peak by at least one of points in the third set of points, which has EIRP with a maximum value or has EIS with a minimum value.

* * * * *